United States Patent

Buer et al.

[11] Patent Number: 5,659,267
[45] Date of Patent: Aug. 19, 1997

[54] HIGH GAIN K-BAND POWER AMPLIFIER WITH UNCONDITIONALLY STABLE MMIC FET CELLS

[75] Inventors: Kenneth Vern Buer; David Warren Corman, both of Gilbert, Ariz.

[73] Assignee: Motorola, Inc., Schaumburg, Ill.

[21] Appl. No.: 558,121

[22] Filed: Nov. 3, 1995

[51] Int. Cl.$^6$ .................. H03F 3/16; H03F 3/60; H03F 3/68
[52] U.S. Cl. .................. 330/277; 330/286; 330/295; 330/307
[58] Field of Search .................. 330/277, 286, 330/295, 307; 257/275, 276, 277

[56] References Cited

U.S. PATENT DOCUMENTS

| | | | |
|---|---|---|---|
| 4,803,443 | 2/1989 | Takagi et al. | 330/277 |
| 5,283,452 | 2/1994 | Shih et al. | 257/277 |
| 5,519,358 | 5/1996 | Tserng | 330/307 |

*Primary Examiner*—Steven Mottola
*Attorney, Agent, or Firm*—Gregory J. Gorrie

[57] ABSTRACT

A MMIC power amplifier (100) uses MMIC FET cells (104, 112) and provides high gain at microwave and millimeter-wave frequencies. The power amplifier includes an input matching network (102), a first plurality of unit FET cells (104) for amplifying in-phase signals provided by the input matching network, a second plurality of unit FET cells (112), an interstage matching network (106) for combining output signals provided by the first plurality of unit FET cells, and providing in-phase signals to the second plurality of unit FET cells; and a combiner (113) for combining output signals of the second plurality of unit FET cells to provide an output signal. The FET cells are designed to be unconditionally stable without the use of an external series gate resistance. The FET cells are combined to provide total device periphery suitable for output power levels exceeding 0.8 watt at frequencies ranging from 19 to 23.5 GHz. The FET cells are designed using device scaling and device modeling techniques. The power amplifier is suitable for applications where high efficiency and high gain are important, such as satellite communication systems.

13 Claims, 5 Drawing Sheets

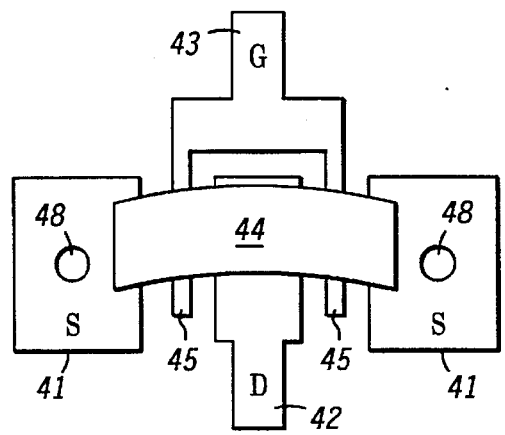
*FIG. 4*
*FIG. 5*
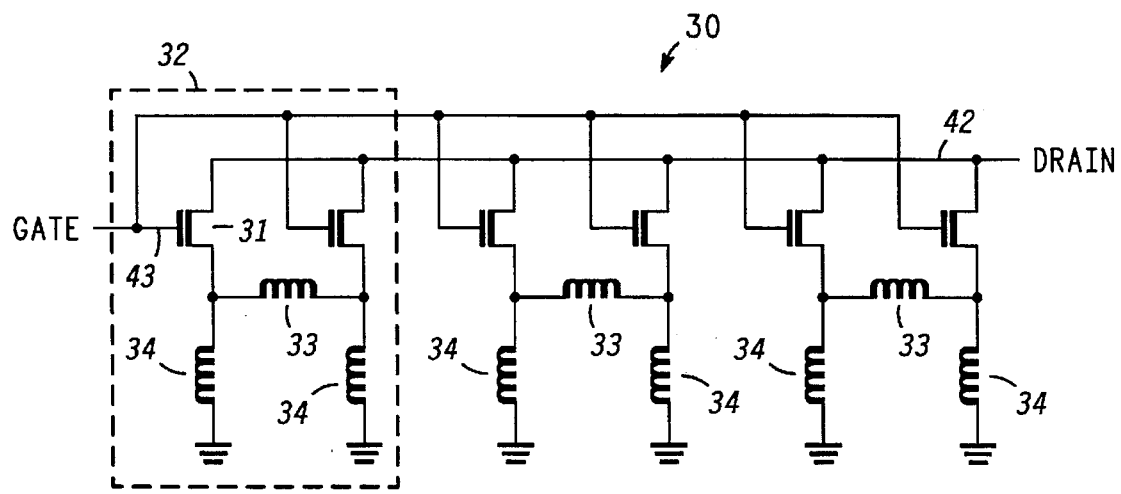

HIGH GAIN K-BAND POWER AMPLIFIER WITH UNCONDITIONALLY STABLE MMIC FET CELLS

FIELD OF THE INVENTION

This invention relates in general to the field of power amplifiers, in particular to K-band microwave power amplifiers and more particularly to Microwave Monolithic Integrated Circuits (MMICs) that use Field Effect Transistors (FETs) in power amplifiers.

BACKGROUND OF THE INVENTION

High frequency stability is a problem in high gain monolithic microwave integrated circuit (MMIC) amplifiers. One common type of high frequency stability problem in microwave amplifiers occurs when input or output impedances of an active device present a negative resistance. This type of stability problem may cause an amplifier to oscillate making the device useless for its intended function. One indicator that a negative resistance type of oscillation may be present is a mathematically derived quantity commonly known as the K-factor. When the K-factor is greater than one, and another mathematical parameter B1 is greater than zero, there is no possibility that the device will present a negative resistance no matter what type of passive source or load impedance the device is presented with. This condition (K>1 and B1>0) is therefore known as unconditional stability.

At higher microwave and millimeter wave frequencies where small parasitic impedances cause drastic changes in the overall load and source impedance, unconditional stability is important for successful MMIC design. Because unconditional stability is required at high frequencies, a traditional method of device stabilization is to use on-chip resistive loading. This will make the device unconditionally stable, but causes severe gain degradation and reduces the overall efficiency of the amplifier. For example, the performance of power amplifiers may be degraded so severely by resistive stabilization, that the devices are not useful as power amplifiers at K-band frequencies.

In addition, the use of higher microwave and millimeter wave frequencies in commercial satellite, mobile communication, and consumer products has fueled the need for high efficiency, low cost MMIC amplifiers. As the need for improved performance at these high frequencies increases, traditional methods of resistively loading the devices for unconditional stability becomes too costly in terms of performance.

Thus what is needed is an unconditionally stable high frequency MMIC amplifier. What is also needed is a high-gain MMIC amplifier where stability is achieved with minimal or no resistive loading. What is also needed is a high frequency MMIC amplifier that provides unconditional stability while improving gain and efficiency without impacting dynamic range of the devices.

What is also needed is a low cost, high gain, high efficiency microwave and millimeter wave frequency power amplifier suitable for use in commercial satellite, mobile communication and consumer products.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference numbers refer to similar items throughout the figures, and:

FIG. 4 illustrates a reduced source inductance two finger FET cell structure in accordance with another preferred embodiment of the present invention;

FIG. 5 illustrates an equivalent lumped element circuit diagram of several unit FET cells in accordance with a preferred embodiment of the present invention;

The exemplification set out herein illustrates a preferred embodiment of the invention in one form thereof, and such exemplification is not intended to be construed as limiting in any manner.

DETAILED DESCRIPTION OF THE DRAWINGS

The present invention provides, among other things, a reduced source inductance monolithic microwave integrated circuit (MMIC) amplifier which achieves unconditional stability at high frequencies. The active devices are subdivided into smaller unit cells, each unit cell having a reduced parasitic source inductance. The smaller unit cells are modeled properly using device scaling, and their outputs are power combined to generate a device of a desired total gate periphery.

The present invention also provides a power amplifier that is unconditionally stable at high frequency. The present invention also provides a high-gain MMIC amplifier where unconditional stability is achieved with minimal resistive loading. The present invention also provides a high frequency MMIC amplifier that provides unconditional stability with improved gain and efficiency without an impact on the dynamic range of the devices. The present invention also provides a low cost, high gain, high efficiency K-Band microwave power amplifier suitable for use in satellite communication systems.

Figure 1:
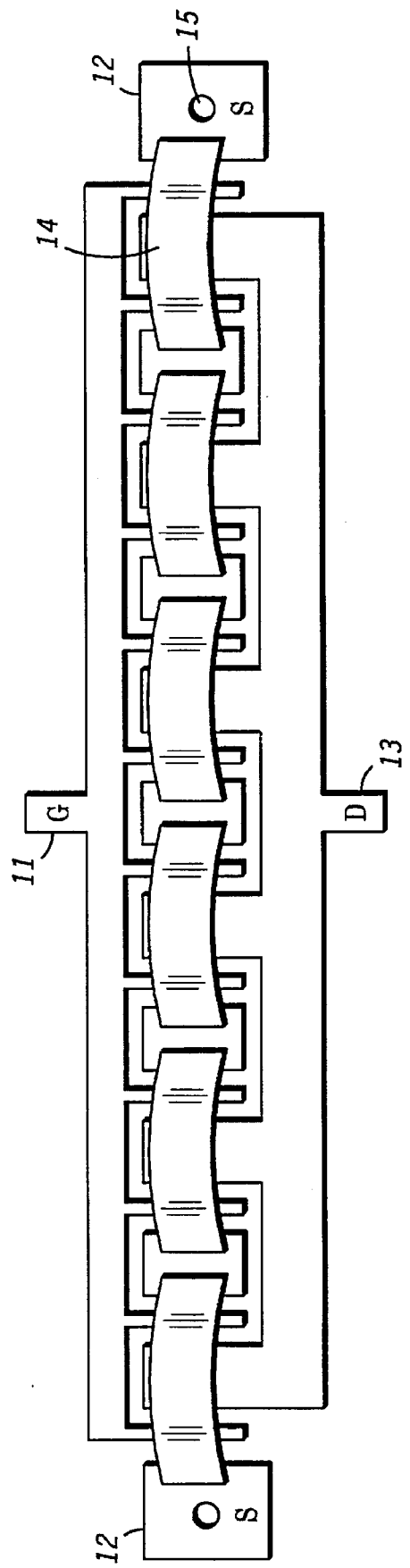
FIG. 1 illustrates a simplified plain view representation of an interdigital FET structure.

FIG. 1 illustrates a simplified plain view representation of interdigital field-effect-transistor (FET) structure 10. For example, FET structure 10 may be a 1.2 mm interdigital Psuedomorphic High Electron Mobility Transistor (PHEMT) device. FET structure 10 is made by interconnecting 12 individual 0.1 mm gates. The source regions are interconnected by air bridges 14. These air bridges are inductive at high frequencies causing a high equivalent parasitic source inductance. FET structure 10 includes gate region 11, drain region 13 and ground pads 12. Ground pads 12 couple the sources of each device to ground through vias 15.

Figure 2:
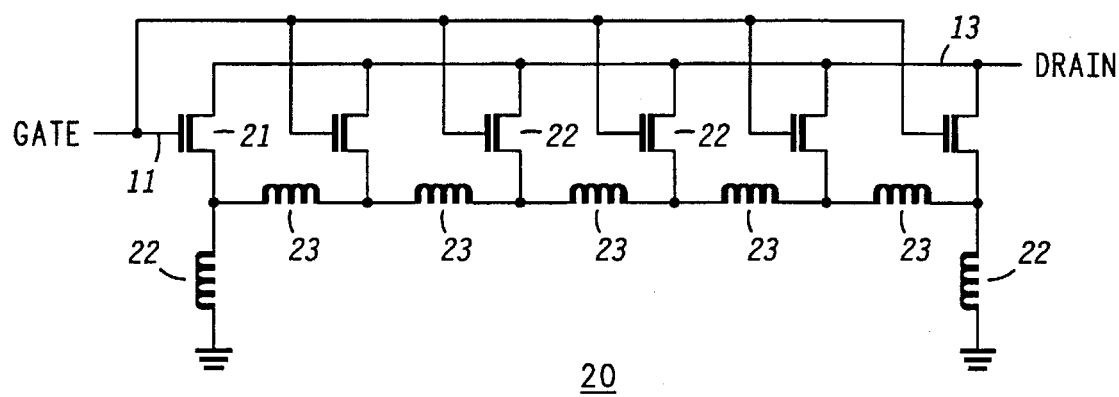
FIG. 2 illustrates an equivalent lumped element circuit diagram of the interdigital FET structure of FIG. 1.

FIG. 2 illustrates an equivalent lumped element circuit diagram of the interdigital FET structure of FIG. 1. Circuit 20 includes individual devices 21 coupled to gate region 11 and drain region 13. The sources of devices 21 are shown as coupled by inductances 23 which result from air bridges 14 (FIG. 1). The sources also have a via inductance 22 resulting from vias 15 (FIG. 1). Note that as more sources are "daisy chained" together, the total effective source inductance increases rapidly. This is because the inner FETs accumulate much more source inductance. The source inductance causes intrinsic series feedback at the device level which reduces gain and causes instability at high frequencies. One way to improve the stability of the device is to heavily resistively load the source to prevent oscillation.

A figure of merit "X" is defined as the inductance of the air bridge divided by one half the inductance of the via. In equation form, the figure of merit is:

$$X = L_{Airbridge}/(L_{via}/2).$$

This figure of merit is a useful measure of the amount of additional source inductance contributed by airbridges. In K-band applications, it was found that if X>0.3 the device was not useful above 20 GHz since the amount of resistive loading required to stabilize the devices caused the gain to approach zero dB. The device and corresponding circuit diagram shown in FIG. 1 and FIG. 2 has a resulting X=2.7 making it useless for K-band designs. This figure of merit example uses $L_{Airbridge}$=20 pH and $L_{via}$=15 pH. The airbridge inductance is the value of inductance from a source to one of the vias averaged across the device, so as the number of fingers in the FET cell increases the $L_{airbridge}$ value increases rapidly.

Figure 3:
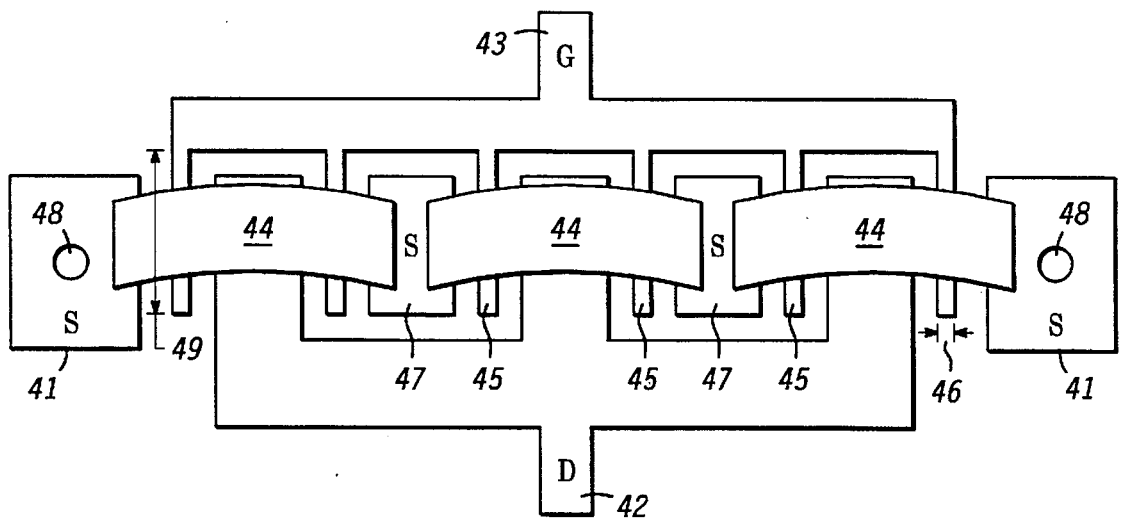
FIG. 3 illustrates a reduced source inductance six finger FET cell structure in accordance with a preferred embodiment of the present invention.

FIG. 3 illustrates a reduced source inductance six finger FET cell structure in accordance with a preferred embodiment of the present invention. FIG. 4 illustrates a reduced source inductance two finger FET cell structure in accordance with another preferred embodiment of the present invention. The devices of the unit FET cells of FIG. 3 and FIG. 4 have drain region 42, gate region 43 and source regions 47. Source regions 47 are coupled to ground by air bridges 44, conductive regions 41 and vias 48. Each gate finger 45 has a unit gate width 49 and a gate length 46. In the preferred embodiment, the unit FET cell structures shown in FIG. 3 and FIG. 4 share conductive regions 41 and vias 48 with another similar unit FET cell. In other words, unit FET cells are combined in a side-by-side parallel configuration to provide a combined device of a greater total gate periphery. This combined device is preferably used in a power amplifier described below.

The reduced source inductance devices shown in FIG. 3 and FIG. 4 dramatically reduce or eliminate the inherent reflective stability problems of MMIC devices. First, device scaling is used to subdivide a device into small unit cells attached to additional source vias. This reduces or eliminates the "daisy chained" source inductance shown in FIG. 2 since there are fewer air bridges between the sources and the nearest via. Each device has a shorter path to ground and hence less parasitic inductance. Device scaling is also used to maximize the gain of the individual device while still providing unconditional stability without additional external resistive loading. This is done by selecting unit gate fingers that are as wide as possible for maximum dynamic range, but are kept small enough that the intrinsic gate resistance (Rg) is just enough to provide intrinsic device stability but does not become too large and degrade the gain.

In the preferred embodiment that uses a six finger FET cell structure, the structure is fabricated on 100 micron (um) thick GaAs substrate. The input power level ranges from −15 dBm to +25 dBm and the output power level is 0.1 Watt minimum. The bias (DC power consumption ) at 175 mA/mm of periphery at 4.5 V, and the RF gain is 6 dB minimum. In this embodiment, the unit FET cells are used in the K-band power amplifier described below. The specific power levels and frequencies depend on the MMIC process used.

Essentially, a unit FET cell is scaled in such a way (for example, by changing both unit gate finger width, and number of gate fingers) so that the FET cell itself is inherently stable. The devices are preferably then interconnected by using microwave power splitting and combining techniques. Once the devices are impedance matched and power combined they provide substantially the same dynamic range capability as large periphery devices, but with much higher gain, higher efficiency, and with virtually no potential reflective stability problems.

FIG. 5 illustrates an equivalent lumped element circuit diagram of several unit FET cells in accordance with a preferred embodiment of the present invention. Box 32 shows an equivalent lumped element circuit of the example FET cell shown in FIG. 4. Each device 31 has a source inductance that includes inductances 33 and 34. Note that as compared to the equivalent circuit of FIG. 2, the equivalent circuit in FIG. 5 shows significantly reduced source inductance to ground. Even though the device of FIG. 5 may have the same total periphery as the device in FIG. 2, the figure of merit is improved dramatically from X=2.7 to X=0.1. This figure of merit example uses $L_{Airbridge}$=1 pH and $L_{via}$=15 pH. Thus this device is useful for much higher frequency designs.

Figure 6:
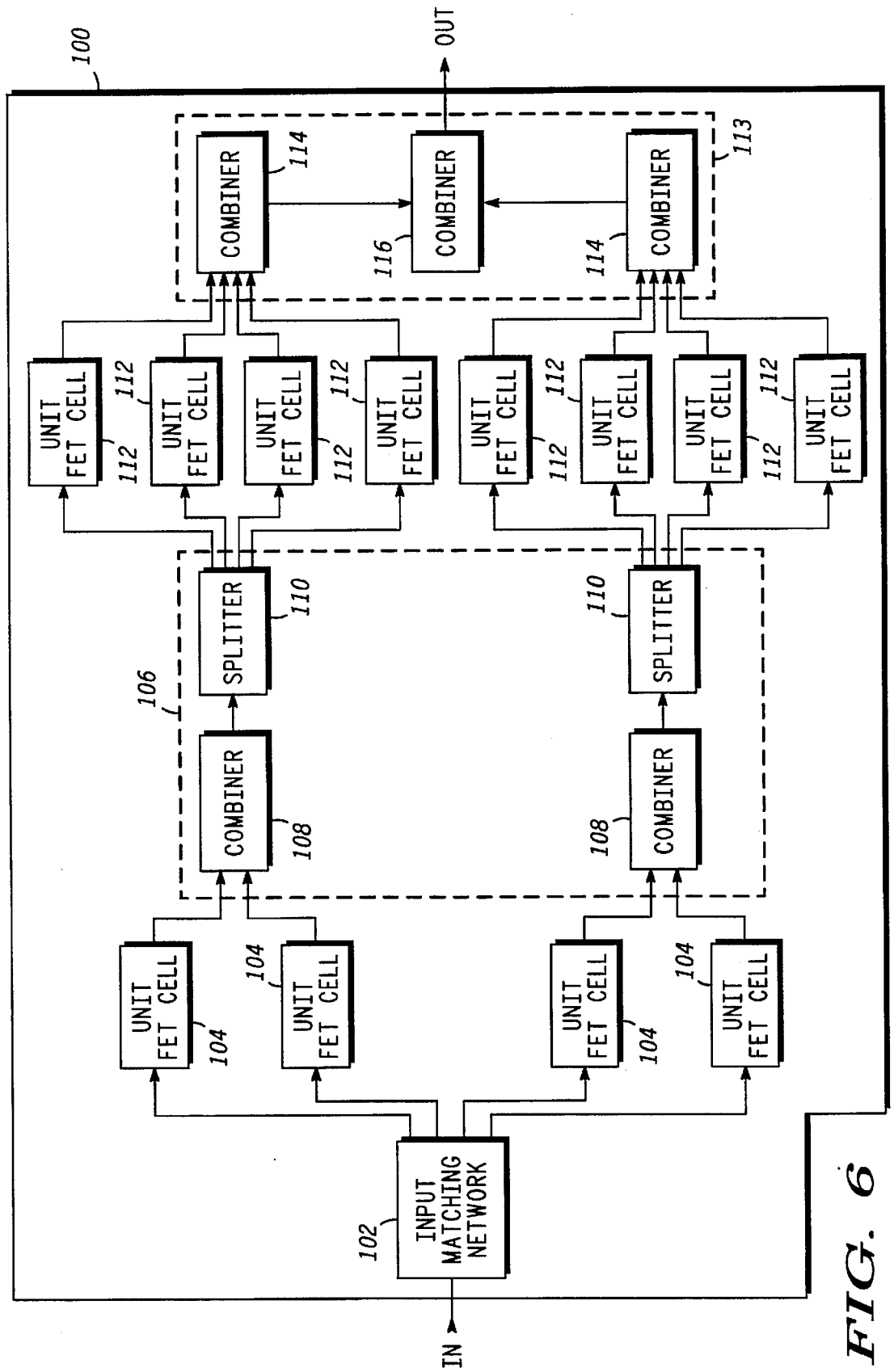
FIG. 6 illustrates a simplified block diagram of a K-band amplifier in accordance with a preferred embodiment of the present invention.

FIG. 6 is a simplified block diagram of a K-band amplifier 100 in accordance with a preferred embodiment of the present invention. K-band amplifier 100 uses a plurality of FET cells that are interconnected by microwave power splitting and combining techniques to provide the same dynamic range capability as an amplifier using large periphery devices, but with much higher gain, higher efficiency, and with virtually no potential reflective stability problems. K-band amplifier 100 includes input matching network 102. Preferably, input matching network 102 provides for four-way power division using cluster matching techniques well known in the art. Input matching network 102 matches an input impedance of K-band amplifier 100 to the input impedance of unit FET cells 104. In the preferred embodiment, K-band amplifier 100 includes four unit FET cells 104 in a parallel configuration. An input RF signal is power divided in input matching network 102 and provided in phase to each unit FET cell 104.

Each unit FET cell 104 is preferably similar to the unit FET cell described above in FIG. 3 and FIG. 4. However, the number of gate fingers per unit FET cell may vary between two and eight gate fingers. Preferably, each unit FET cell 104 has six gate fingers, however the number of gate fingers may be varied depending on frequency requirements. In the preferred embodiment, each unit FET cell 104 is designed using the design procedure discussed below. Unit FET cells 104 represent a first amplification stage of K-band amplifier 100.

The output of unit FET cells 104 is provided to interstage matching network 106. Interstage matching network 106 combines the output of unit FET cells 104 in phase, and power divides these signals to provide input signals for a second stage amplification by unit FET cells 112. In the preferred embodiment, interstage matching network 106 combines the output of two unit FET cells 104 with combiners 108, and provides a four-way power splitting function in splitters 110. Interstage matching network is accomplished preferably through cluster matching techniques well known in the art.

Unit FET cells 112 provide a second stage of amplification in K-band amplifier 100. Each unit FET cell 112 is preferably similar to the unit FET cell described above in FIG. 3 and FIG. 4. The number of gate fingers per unit FET cell may vary between two and eight gate fingers. Preferably, each unit FET cell 112 has six gate fingers, however the number of gate fingers may be varied depending on frequency requirements. In the preferred embodiment, each unit FET cell 112 is designed using the design procedure discussed below. Preferably, unit FET cells 112 are identical to unit FET cells 104, although there is no requirement that they be identical.

K-band amplifier 100 also includes combiner 113 which provides in-phase power combining of output signals from unit FET cells 112. Preferably combiner 113 includes combiners 114 and 116 configured as shown. Combiner 113 preferably provides for matching and preferably utilizes cluster matching techniques well known in the art.

In the preferred embodiment, K-band amplifier 100 is fabricated on a 4 mil GaAs substrate using a quarter micron gate length PHEMT process. For example, one such suitable process is the Raytheon 06A MMIC power PHEMT process. In the preferred embodiment, K-band amplifier 100 provides at least 0.8 watt of output power desirably for frequencies ranging between 10 and 40 GHz and preferably for frequencies ranging between 19 and 23.5 GHz. The specific power levels and frequencies depend on the MMIC process used. The present invention as described herein significantly extends the frequency range of fabrication processes. For example, the Raytheon 06A MMIC power PHEMT process, which uses a gate length of 0.25 um, is typically good to about 20 GHz. The present invention extends the usefulness of this process to about 40 GHz. In another example, the Raytheon 04 power MESFET process, which uses a gate length of 0.5 um, is typically good to about 10 GHz. The present invention should extend the usefulness of this process to around 20 GHz.

In the preferred embodiment where K-band power amplifier 100 is fabricated on 4 mil (100 micron) thick GaAs substrate, the input power level ranges from -15 dBm to +19 dBm, and the output power level is 29 dBm minimum (0.8 watt min.). The DC power consumption is less than 5.7 watts (1.25 A from a 4.5 V supply) and the RF gain is at least 11 dB. The bandwidth is preferably greater than 6 GHz. In this preferred embodiment, K-band power amplifier 100 may be used to support K-band cross links between satellites and K-band down links to gateways in commercial satellite communication systems.

Figure 7:
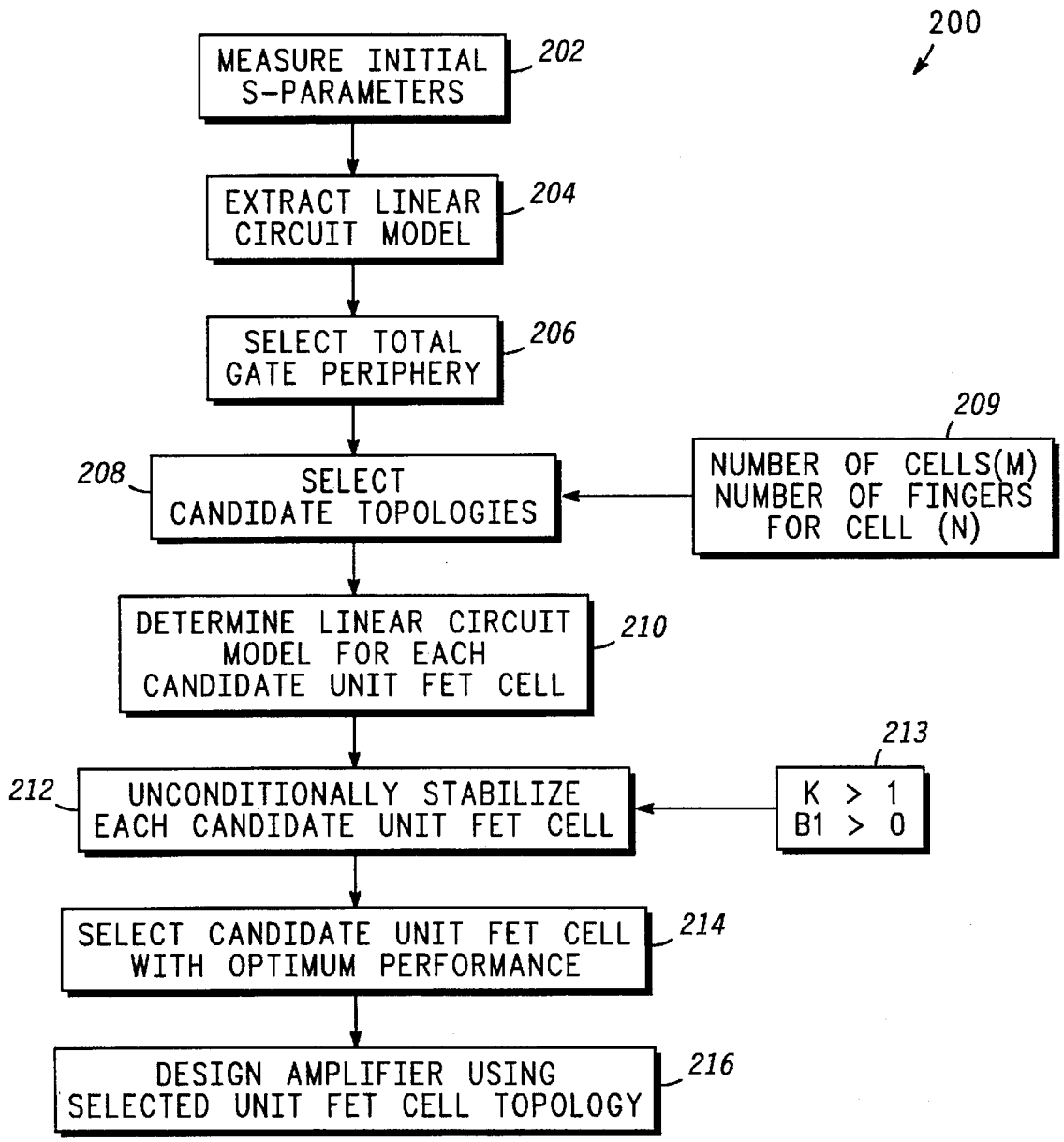
FIG. 7 illustrates a procedure for designing a unit FET cell in accordance with a preferred embodiment of the present invention.

FIG. 7 illustrates procedure 200 for designing a unit FET cell in accordance with a preferred embodiment of the present invention. As discussed above, one traditional way of making a device unconditionally stable at high frequencies is to resistively load the device. Series resistive loading on the gate causes the K-factor to increase at high frequencies but causes severe gain degradation. Gain degradation at lower frequencies is acceptable, since devices generally have very high gain at lower frequencies. At high frequencies, the gain degradation may be as much as 50% or more causing lower efficiency and the need for additional stages. Procedure 200 provides for unconditional stability while improving the available gain and efficiency without impacting the dynamic range of the device. All of these improvements are realized without any changes to the MMIC fabrication process by using design techniques of device scaling and power combining. Use of thicker (and therefore higher yield) MMIC wafers is preferred for high frequency power amplifier designs since source inductance is reduced by eliminating air bridges rather than shortening the length of vias through the wafer substrate.

The need for low cost, high gain, high efficiency K-band microwave power amplifiers for use on commercial satellite programs resulted in the choice of a PHEMT MMIC process for the preferred embodiment of the present invention. A device and the process should be characterized before actual design can begin. As part of the process characterization, device scaling is performed. Several different sizes of devices are fabricated, and single stage power amplifiers are designed. A substantial difference in the amount of K-factor rollover is present in the scaled devices. The higher source inductance of the larger devices causes the problem. Along with an optimum number of gate fingers, there is also an optimum unit gate finger width that provides unconditional stability without additional external resistive loading. By subdividing the devices to reduce the source inductance and by appropriate device scaling, the problem of K-factor rollover is solved without compromising any device performance.

Procedure 200 described below eliminates potential high frequency stability problems by minimizing source inductance through device scaling and segmenting rather than MMIC production process changes. The process provides unit FET cells with unconditional stability without the need for resistive loading. Procedure 200 also incorporates the use of device scaling as a design parameter to provide an unconditionally stable unit FET cell. Procedure 200 also uses unit gate finger width scaling as a design parameter to maximize the gain of unit FET cells thus simultaneously maximizing device performance while providing an unconditionally stable unit FET cell at high microwave and millimeter-wave frequencies. Procedure 200 also provides a method for designing unconditionally stable MMIC power amplifiers using standard MMIC processes. Procedure 200 also provides a method for designing an unconditionally stable FET cell with maximum performance. Procedure 200 also provides a method of scaling MMIC active devices for maximum performance and unconditional stability. The FET cells designed using procedure 200 may be power combined to provide a power amplifier with high dynamic range, high gain, high efficiency and unconditional stability.

In task 202, an initial device structure is selected and an initial set of S-parameters is measured. Preferably, a device is chosen based on a total gate periphery, however standard sample devices from a foundry may be suitable for these measurements. Preferably, a large device (i.e., 1200 um) and a small device (i.e., 200 um) are selected for measurements to provide added confidence in device scaling. The output power requirements of the amplifier in general determine the total gate periphery. For example, 12 finger, 100 micron gate width devices having a periphery of 1200 microns are suitable for output power levels of around one-third watt at K-band frequencies.

In task 204, the linear circuit model of the device is extracted using the S-parameters obtained in task 202. A typical linear circuit model includes parameters such as gate resistance (Rg), gate inductance (Lg), source resistance (Rs), source inductance (Ls), drain resistance (Rd), drain inductance (Ld), input resistance (Ri), gate-source capacitance (Cgs), gate-drain capacitance (Cgd), drain-source capacitance (Cds), drain-source resistance (Rds), transconductance (gm), and transconductance time constant (tau). A detailed explanation of these parameters is found in "Microwave MESFETs and HEMTs", Artech House Inc., by J. Michael Golio. These parameters are well understood by those of ordinary skill in the art. These parameters are also included in most microwave simulation tools.

In task 206, a total gate periphery is selected. The output power requirements of the amplifier in general determine the total gate periphery (WG). Most merchant foundries advertise a power density figure of merit for their devices. This figure of merit is in units of watts/millimeter (w/mm) of total periphery. Therefore, by knowing the power level requirements, the total periphery in millimeters can be determined. However, foundries may quote an optimistic number like 0.8 W/millimeter when the real number that can be used is about 0.35 W/millimeter. The power density number is dependent on frequency of operation and the MMIC process used. Once the required periphery is calculated, a number of standard cells are combined to exceed the requirement. According to the present invention, the most favorable FET cells are used in the amplifier topology. Task 206 is independent of the device characterized in task 202 since the device is scaled to a new number of gate fingers (N) and combined with M other cells. In the preferred embodiment, the total gate periphery is between 4 and 6 millimeters.

In task 208, candidate topologies are selected for unit FET cells. Inputs 209 to task 208 may include the number of unit cells (M), the number of gate fingers per unit cell (N) and the unit gate width (UGW) of each unit FET cell. The number of unit cells (M) multiplied by the number of gate fingers per unit cell (N) multiplied by the unit gate width (UGW) of each unit FET cell should approximate the total gate periphery (WG) from task 206. For each combination of N and M, which are integers, a unit gate width is determined. M and N may be arbitrarily selected subject to the constraints discussed above. Preferably, candidate topologies are determined by varying both the unit gate width and the number of gate fingers.

In the preferred embodiment, tasks 202 and 204 do not have to be performed prior to tasks 206 and 208. For example, tasks 202 and 204 may be performed subsequently or in parallel with tasks 206 and 208.

In task 210, the linear circuit model for each candidate unit FET cell is determined. The linear circuit model coefficients are calculated using, among other things, device scaling rules. The linear circuit model coefficients and device scaling parameters utilize the linear circuit model extracted in task 204.

In task 212, each candidate unit FET cell is unconditionally stabilized. Preferably, an external gate resistance ($R_{g\_ext}$) is added. Ideally, a device is unconditionally stable when the stability conditions of both stability parameters (K>1 and B1>0) are met. Outputs 213 of task 212 include stability parameters K and B1. Preferably, task 212 will be able to stabilize at least one candidate unit FET cell without any additional external gate resistance. Preferably, unit gate fingers are selected that are as wide as possible for maximum dynamic range, but are kept small enough that the intrinsic gate resistance (Rg) is just enough to provide intrinsic device stability but does not become too large and degrade the gain.

In task 214, a candidate unit FET cell is selected. Preferably, the candidate unit FET cell selected has the best gain at the desired frequency. Furthermore, the candidate unit FET cell requiring the lowest external gate resistance for unconditional stability will generally have the best gain. In one preferred embodiment, N is six and M is 8 with UGW being around 100 um for a total gate periphery of 4.8 millimeters. Tasks 212 and 214 realize maximum gain for given peripheries.

In task 216, a power amplifier is designed using combinations of candidate unit FET cells selected in task 214. One such suitable power amplifier is described above in reference to FIG. 6.

Thus, a high gain K-band power amplifier that uses unconditionally stable MMIC FET cells has been described which overcomes specific problems and accomplishes certain advantages relative to prior art methods and mechanisms. The improvements over known technology are significant. The expense, complexities, and high cost of high performance MMIC amplifiers are avoided. This invention provides unconditional stability without costly and impractical process changes and without performance degradation. The invention attacks the root cause of the stability problem (source inductance), and provides unconditional stability without any reduction in available gain or efficiency. In fact, because of the reduction in series feedback caused by the source inductance (along with the associated resistance), the available gain and efficiency actually increase.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A microwave power amplifier comprising:
    a first plurality of unconditionally stable unit FET cells in a parallel configuration for amplifying signals, said first plurality having a total gate periphery based on a maximum output power level of said power amplifier;
    a signal splitter for providing said signals in phase to each unit FET cell of said first plurality; and
    a combiner for in-phase combining outputs of each of said unit FET cells to provide an output signal,
    wherein said unit FET cells are fabricated on an MMIC die, each of said unit FET cells being comprised of a single drain region inbetween two gate fingers, and said two gate fingers being inbetween two source regions electrically coupled with an airbridge, each source region being coupled to a ground plane of said MMIC by its own conductive via, and
    wherein said first plurality comprises at least two unit FET cells sharing one of said source regions.

2. A microwave amplifier as claimed in claim 1 wherein said first plurality of unit FET cells comprises at least two pairs of said unit FET cells, each unit FET cell of each pair having a single drain region inbetween two gate fingers, said two gate fingers being inbetween two source regions electrically coupled with an airbridge, each source region being coupled to said ground plane of said MMIC die by a conductive via, said FET cells of each pair sharing one of said source regions, said pairs sharing adjacent of said source regions.

3. A microwave power amplifier as claimed in claim 2 wherein each of said unit FET cells includes said number between two and eight of gate fingers, and
    wherein said first plurality of unit FET cells includes "M" of said unit FET cells, and wherein each gate finger additionally has a gate length associated therewith,
    wherein said total gate periphery equals "M" multiplied by said number of gate fingers multiplied by said gate width, and
    wherein a combination of said number of gate fingers and said gate width are selected to provide a condition of unconditionally stability for each of said unit FET cells with a minimum added source resistance.

4. A microwave power amplifier as claimed in claim 3 wherein each unit FET cell of said first plurality has source regions coupled together by air bridges which are coupled to a ground plane by conductive vias, said air bridges and said conductive vias having parasitic inductances associated therewith, and wherein each unit FET cell of said first plurality has an equivalent linear circuit model associated therewith, and wherein candidate of said unit FET cells are unconditionally stabilized by adding said minimum added source resistance to an equivalent circuit that includes said equivalent linear circuit model and said parasitic inductances, and wherein said candidate of said unit FET cells include various combinations of said number of gate fingers and said gate width, and wherein individual gate peripheries of "M" of each of said candidate unit FET cells exceed said total gate periphery.

5. A microwave power amplifier as claimed in claim 4 further comprising:

an input matching network;

a second plurality of unit FET cells for amplifying in-phase signals provided by said input matching network, each unit FET cell of said second plurality has a number of gate fingers, each gate finger having a gate width and gate length, said number of gate fingers and said gate width are selected to provide a condition of unconditionally stability with minimum added source resistance;

an interstage matching network for combining output signals provided by said second plurality of unit FET cells, and providing in-phase signals to said first plurality of unit FET cells; and a combiner for combining output signals of said first plurality of unit FET cells to provide an output signal, wherein said input matching network, interstage matching network, the combiner and the first and second pluralities of unit FET cells are fabricated on a Gallium Arsenide substrate.

6. A microwave amplifier as claimed in claim 5 wherein said second plurality of unit FET cells comprises two groups of four of said unit FET cells, each unit FET cell of each group having a single drain region inbetween two gate fingers, said two gate fingers being inbetween two source regions electrically coupled with an airbridge, each source region being coupled to said ground plane of said MMIC die by a conductive via, said pairs sharing adjacent of said source regions.

7. A microwave power amplifier as claimed in claim 6 wherein said unit FET cells of said first and second pluralities are fabricated at a foundry, and said equivalent linear circuit model is determined by extraction of linear circuit models of similar devices fabricated from said foundry.

8. A microwave power amplifier as claimed in claim 7 wherein said first and second plurality of unit FET cells are fabricated on said Gallium Arsenide substrate in an electrically parallel configuration, said first plurality configured to provide said total gate periphery of said microwave power amplifier.

9. A microwave power amplifier as claimed in claim 8 wherein said power amplifier provides at least 0.8 watts output power for a frequency in a range from 19 to 23.5 GHz, said unit FET cells of said first and second pluralities include Psuedomorphic High Electron Mobility Transistor (PHEMT) devices, said substrate has a thickness of approximately 100 micrometers, and said total gate periphery is between 4.5 and 5 millimeters.

10. A microwave power amplifier as claimed in claim 9 wherein each of said unit FET cells of said first plurality provides an individual output power level of at least 0.1 watt for said frequency.

11. A power amplifier for amplifying K-band signals comprising:

an input matching network;

a first plurality of unconditionally stable unit FET cells in a parallel configuration for amplifying in-phase signals provided by said input matching network;

a second plurality of unconditionally stable unit FET cells;

an interstage matching network for combining output signals provided by said first plurality of unit FET cells, and providing in-phase signals to said second plurality of unit FET cells; and a combiner for combining output signals of said second plurality of unit FET cells to provide an output signal, wherein said input matching network, interstage matching network, the combiner and the first and second pluralities of unit FET cells are fabricated on a single MMIC die, and wherein each unit FET cell of said first and second pluralities is comprised of a single drain region inbetween two gate fingers, and said two gate fingers being inbetween two source regions electrically coupled with an airbridge, each source region being coupled to ground plane of said MMIC die by its own conductive via, and wherein said first and second pluralities each comprise at least two unit FET cells sharing one of said source regions.

12. A power amplifier as claimed in claim 11 wherein said first plurality of unit FET cells comprises at least two pairs of said unit FET cells, each unit FET cell of said pair having a single drain region inbetween two gate fingers, said two gate fingers being inbetween two source regions electrically coupled with an airbridge, each source region being coupled to said ground plane of said MMIC die by a conductive via, said FET cells of each pair sharing one of said source regions, said pairs sharing adjacent of said source regions, and said second plurality of unit FET cells comprises two groups of four of said unit FET cells, each unit FET cell of said group having a single drain region inbetween two gate fingers, said two gate fingers being inbetween two source regions electrically coupled with an airbridge, each source region being coupled to ground plane of said MMIC die by a conductive via, said groups sharing adjacent of said source regions.

13. A power amplifier as claimed in claim 12 wherein each unit FET cell of said first and second plurality of unit FET cells has a number of gate fingers between two and eight, each gate finger having a gate width and gate length associated therewith, and wherein a total gate periphery of said second plurality of unit FET cells is based on said gate width, said number of gate fingers and a number of unit FET cells of said second plurality, wherein said total gate periphery being sufficient to provide at least 0.8 watts for said output signal, wherein said air bridges and said conductive vias have parasitic inductances associated therewith, and wherein each unit FET cell of said first and second plurality have an equivalent linear circuit model associated therewith, and wherein candidate of said unit FET cells are selected for a condition of unconditionally stability with minimum source resistance, said condition based on an equivalent circuit that includes said equivalent linear circuit model and said parasitic inductances, and wherein said candidate of said unit FET cells include various combinations of said number of gate fingers and variations of said gate width.

* * * * *